United States Patent
Zonca et al.

(10) Patent No.: US 6,946,673 B2
(45) Date of Patent: Sep. 20, 2005

(54) INTEGRATED RESISTOR, PHASE-CHANGE MEMORY ELEMENT INCLUDING THIS RESISTOR, AND PROCESS FOR THE FABRICATION THEREOF

(75) Inventors: Romina Zonca, Paullo (IT); Maria Santina Marangon, Merate (IT); Giorgio De Santi, Milan (IT)

(73) Assignees: STMicroelectronics S.r.l., Agrate Brianza (IT); Ovonyx, Inc., Boise, ID (US)

( * ) Notice: Subject to any disclaimer, the term of this patent is extended or adjusted under 35 U.S.C. 154(b) by 53 days.

(21) Appl. No.: 10/345,129

(22) Filed: Jan. 14, 2003

(65) Prior Publication Data

US 2003/0161195 A1 Aug. 28, 2003

(30) Foreign Application Priority Data

Jan. 17, 2002 (EP) .............................................. 02425013

(51) Int. Cl.[7] .......................... H01L 47/00; H01L 29/00
(52) U.S. Cl. .............................. 257/3; 257/529; 257/536
(58) Field of Search ............................ 257/3, 529, 536, 257/537, 538

(56) References Cited

U.S. PATENT DOCUMENTS

| | | | |
|---|---|---|---|
| 3,271,591 A | 9/1966 | Ovshinsky | 307/88.5 |
| 4,181,913 A | 1/1980 | Thornburg | 357/2 |
| 5,166,758 A | 11/1992 | Ovshinsky et al. | 257/3 |
| 5,687,112 A | 11/1997 | Ovshinsky | 365/163 |
| 5,714,768 A | 2/1998 | Ovshinsky et al. | 257/40 |
| 5,933,365 A | 8/1999 | Klersy et al. | 365/148 |
| 6,064,079 A | 5/2000 | Yamamoto et al. | 257/101 |
| 6,121,127 A | 9/2000 | Shibata et al. | 438/604 |
| 6,617,192 B1 * | 9/2003 | Lowrey et al. | 438/95 |
| 6,791,102 B2 * | 9/2004 | Johnson et al. | 257/3 |
| 2002/0096512 A1 * | 7/2002 | Abbott et al. | 219/543 |
| 2003/0151116 A1 * | 8/2003 | Cabral et al. | 257/532 |
| 2004/0115372 A1 * | 6/2004 | Lowrey | 428/34.1 |

FOREIGN PATENT DOCUMENTS

WO    WO 02/09206 A1    1/2002

OTHER PUBLICATIONS

Sun, X. et al., "Reactively Sputtered Ti–Si–N Films I. Physical Properties," *J. Appl. Phys.*, 81(2):656–663, Jan. 1997.

Nicolet, M., "Diffusion Barriers in Semiconductor Contact Technology," in *Proceedings of Defect and Diffusion Forum vols. 143–147*, Pasadena, CA, 1997, pp. 1271–1284.

Sankaran, S. et al., "Development of TiSiN Diffusion Barriers for Cu/SiLK Metallization Schemes," *IEEE*, pp. 40 and 42, 2000.

* cited by examiner

*Primary Examiner*—T. N. Quach
(74) *Attorney, Agent, or Firm*—Lisa K. Jorgenson; Robert Iannucci; Seed IP Law Group PLC

(57) ABSTRACT

A vertical-current-flow resistive element includes a monolithic region having a first portion and a second portion arranged on top of one another and formed from a single material. The first portion has a first resistivity, and the second portion has a second resistivity, lower than the first resistivity. To this aim, a monolithic region with a uniform resistivity and a height greater than at least one of the other dimensions is first formed; then the resistivity of the first portion is increased by introducing, from the top, species that form a prevalently covalent bond with the conductive material of the monolithic region, so that the concentration of said species becomes higher in the first portion than in the second portion. Preferably, the conductive material is a binary or ternary alloy, chosen from among TiAl, TiSi, $TiSi_2$, Ta, WSi, and the increase in resistivity is obtained by nitridation.

20 Claims, 3 Drawing Sheets

INTEGRATED RESISTOR, PHASE-CHANGE MEMORY ELEMENT INCLUDING THIS RESISTOR, AND PROCESS FOR THE FABRICATION THEREOF

BACKGROUND OF THE INVENTION

1. Field of the Invention

The present invention relates to an integrated resistor, a phase-change memory element including this resistor, and a process for the fabrication thereof.

2. Description of the Related Art

As is known, phase-change memory elements, or PCM elements, exploit the characteristics of a class of materials able to change between two phases having distinct electrical characteristics. For example, these materials may change from an amorphous, disorderly phase to a crystalline or polycrystalline, orderly phase, and the two phases are associated to considerably different values of resistivity.

At present, alloys of elements of group VI of the periodic table, such as Te or Se, referred to as chalcogenides or chalcogenic materials, can advantageously be used in phase-change cells. The chalcogenide that currently offers the most promise is formed by a Ge, Sb and Te alloy ($Ge_2Sb_2Te_5$) and is widely used for storing information in overwritable disks.

In chalcogenides, the resistivity varies by two or more orders of magnitude when the material passes from the amorphous phase (more resistive) to the crystalline phase (more conductive) and vice versa. The characteristics of the chalcogenides in the two phases are shown in FIG. 1. As may be noted, at a given read voltage, here designated by Vr, there is a resistance variation of more than 10.

Phase change may be obtained by locally increasing the temperature, as shown in FIG. 2. Below 150° C. both phases are stable. Above 200° C. (nucleation start temperature, designated by $T_x$), fast nucleation of the crystallites takes place, and, if the material is kept at the crystallization temperature for a sufficient length of time (time $t_2$), it changes its phase and becomes polycrystalline. To bring the chalcogenide back into the amorphous state, it is necessary to raise the temperature above the melting temperature $T_m$ (approximately 600° C.) and then to cool the chalcogenide off rapidly (time $t_1$).

From the electrical standpoint, it is possible to reach both the critical temperatures, namely crystallization and melting temperature, by causing a current to flow through a resistive element which heats the chalcogenic material by Joule effect.

The basic structure of a phase-change memory element 1 which operates according to the principles described above is shown in FIG. 3 and comprises a resistive element 2 (heater) and a programmable element 3. The programmable element 3 is made of a chalcogenide and is normally in the polycrystalline state in order to enable a good flow of current. One part of the programmable element 3 is in direct contact with the resistive element 2 and forms the area involved in the phase change, hereinafter referred to as phase-change portion 4.

If an electric current having an appropriate value is made to pass through the resistive element 2, it is possible to heat the phase-change portion 4 selectively up to the crystallization temperature and to the melting temperature and to cause phase change. In particular, if a current I is made to pass through a resistive element 2 having resistance R, the heat generated is equal to $I^2R$.

At present, the resistive element 2 is obtained by deposition—using PVD (Physical Vapor Deposition), Reactive PVD and CVD (Chemical Vapor Deposition)—of materials having a resistivity of between a few hundred $\mu\Omega cm$ and a few ten $m\Omega cm$. The material thus obtained has a substantially homogeneous resistance in all directions.

The memory element described above is disadvantageous since it has a high dissipation on account of the high resistance of the resistive element, even if the portion useful for generating the phase change heat for the memory element 1 is only one part of its volume. A high level of dissipation may, in fact, be harmful for the materials and components integrated in the chip. The problems associated with dissipation of the entire resistive element moreover impose design constraints on the values of resistivity that can be used for the resistive element, as well as on the programming currents and voltages, giving rise to high levels of consumption.

BRIEF SUMMARY OF THE INVENTION

An embodiment of the present invention provides a resistive element that overcomes the described disadvantages.

The resistive element is a vertical-current-flow resistive element that includes a monolithic region having a first portion and a second portion arranged on top of one another. The monolithic region is formed by a single material and has a height greater than at least one other dimension. The first portion has a first resistivity and the second portion has a second resistivity lower than the first resistivity.

BRIEF DESCRIPTION OF THE SEVERAL VIEWS OF THE DRAWING(S)

For a better understanding of the present invention, a preferred embodiment thereof is now described, purely by way of non-limiting example, with reference to the attached drawings, wherein.

Figure 1:
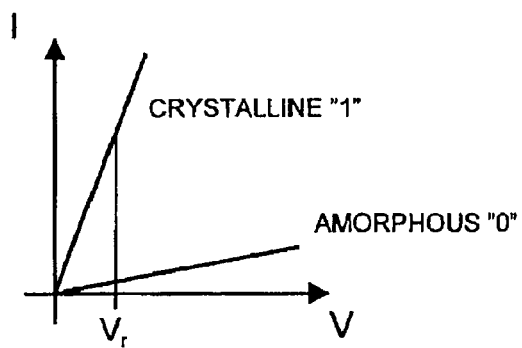
FIG. 1 shows the current-versus-voltage characteristic of a phase-change material.
Figure 2:
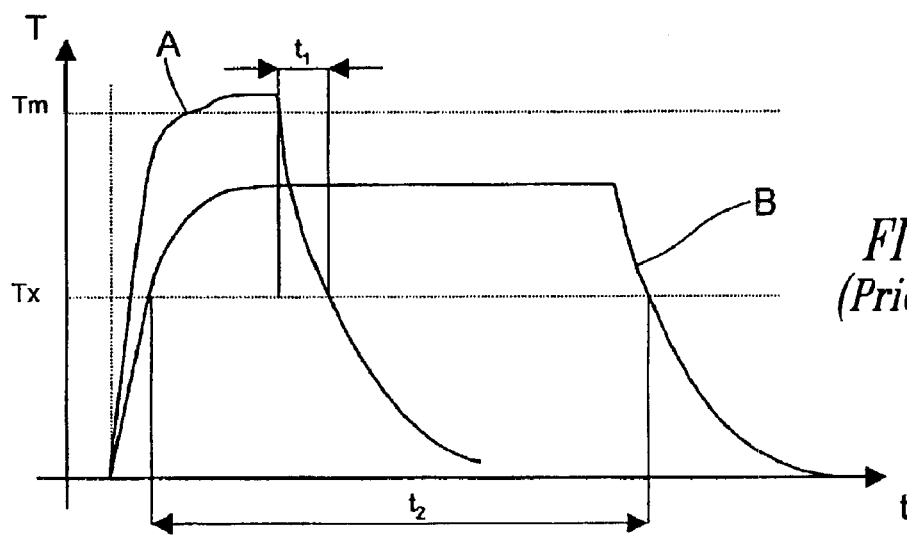
FIG. 2 shows the temperature-versus-current plot of a phase-change material.
Figure 3:
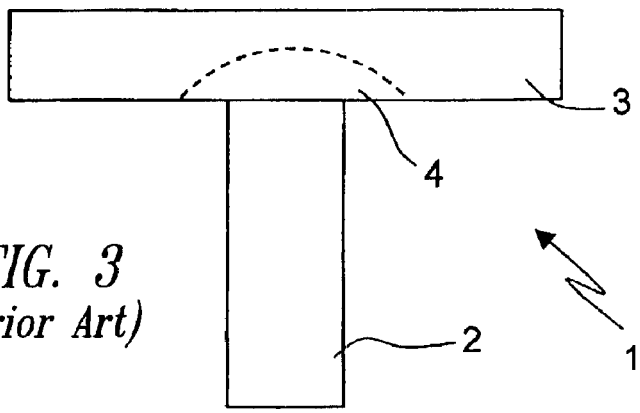
FIG. 3 shows the basic structure of a PCM element.
Figure 4:
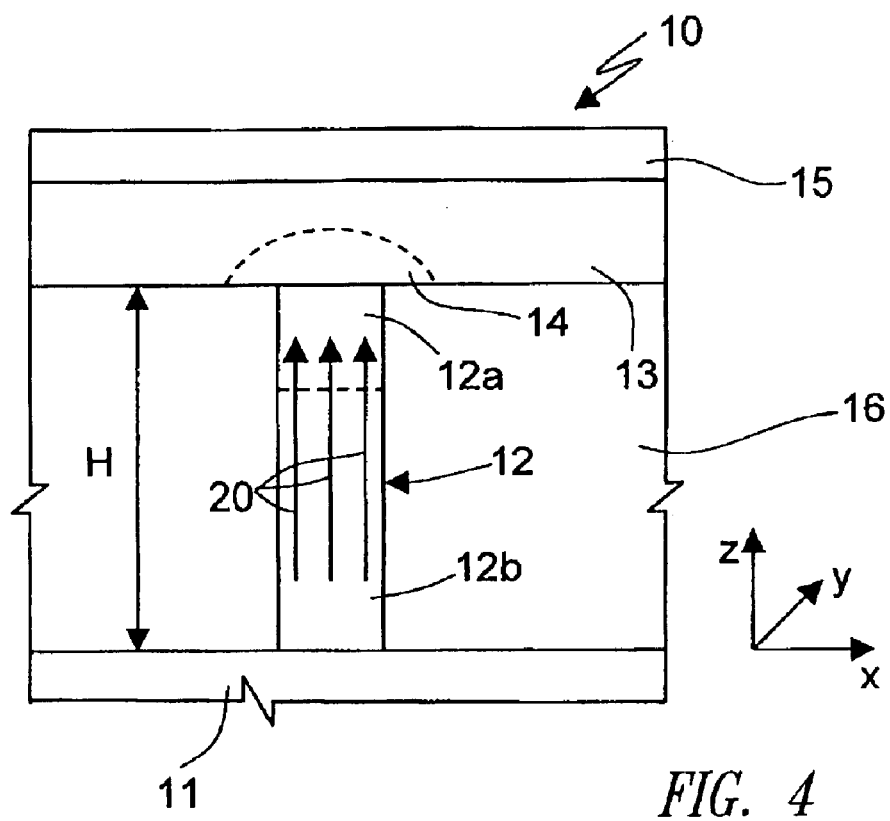
FIG. 4 is a cross-section of a resistive element according to the invention.
Figure 5:
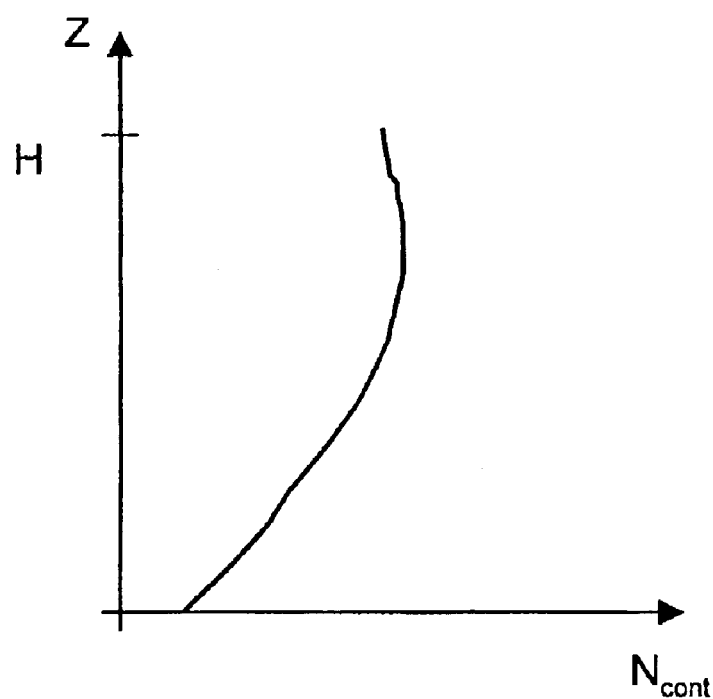
Figure 6:
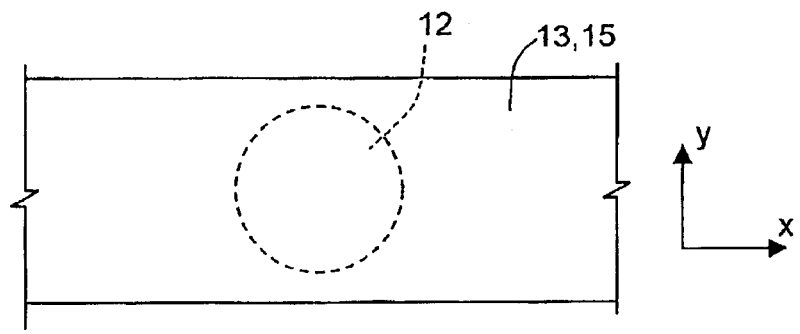
Figure 7:
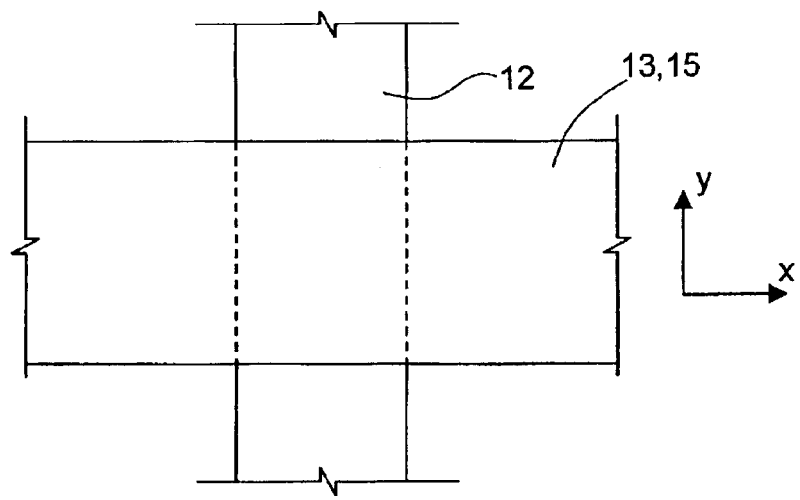
Figure 8:
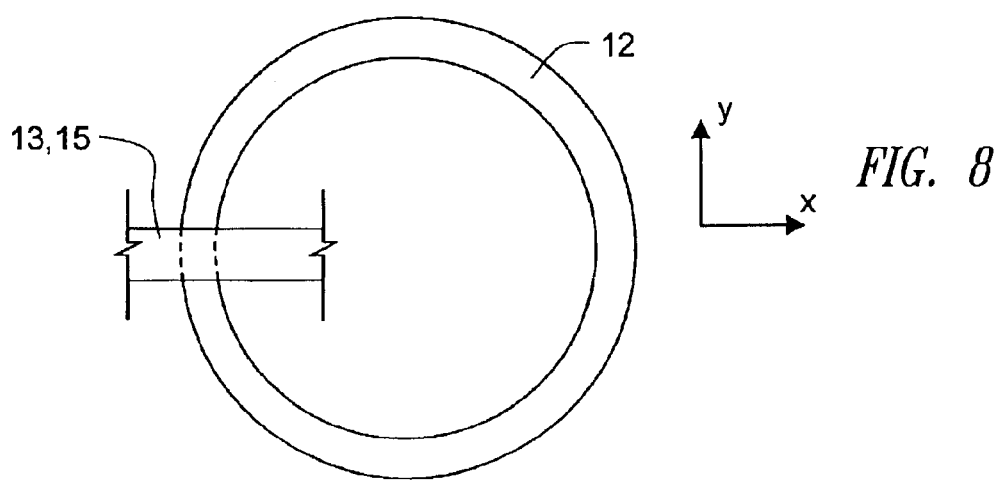

FIG. 5 presents a concentration plot of ions designed to increase the resistivity of the resistive element of FIG. 4; and FIGS. 6, 7 and 8 are top plan views of the resistive element of FIG. 4, according to three different embodiments.

DETAILED DESCRIPTION OF THE INVENTION

FIG. 4 shows a PCM memory element 10 comprising a bottom electrode 11, of electrically conductive material; an insulating layer 16, arranged on top of the bottom electrode 11; a resistive element 12, which extends vertically inside the insulating layer 16 and is in contact with the bottom electrode 11; a polycrystalline layer 13, which extends on top of the insulating layer 16 and has a portion (hereinafter referred to as phase-change portion 14) in contact with the resistive element 12; and a top electrode 15, of conductive material, which extends on top of the polycrystalline layer 13.

The resistive element 12, of overall height H, is of the vertical-current-flow type and has a height or thickness H in the Z direction much greater than at least one of the other dimensions (width in the X direction and depth in the Y direction). In particular, the resistive element 12 may be column-shaped, with a depth (in the Y direction) comparable to the width in the X direction, as shown in the schematic top plan view of FIG. 6, or else wall-shaped, having a depth much greater than the width in the X direction, as shown in the schematic plan view of FIG. 7, or yet again may have a closed shape, such as the annular shown in the schematic top plan view of FIG. 8.

The resistive element 12 is formed by a monolithic region made of a material selected among TiAlN, TiSiN, TiSi$_2$N, TaN, WSiN and has a first portion 12a, having high resistivity, and a second portion 12b, of lower resistivity, arranged on top of one another. In the example illustrated, the first portion 12a is arranged at the top, and the second portion 12b is arranged at the bottom. The resistivity of the resistive element 12 may vary gradually, or else sharply, between the first portion 12a and the second portion 12b.

The resistive element 12 of FIG. 4 is obtained starting from a material having an intrinsically medium-to-low resistivity, such as TiAl, TiSi, TiSi$_2$, Ta, WSi, or another binary or ternary alloy with similar characteristics, and is subsequently treated so as to increase the resistivity of the first portion 12a with respect to the second portion 12b.

Preferably, the starting material of the resistive element 12 is enriched with nitrogen ions or nitrogen radicals, so as to increase local resistivity. For example, the enrichment may be achieved by plasma implantation or nitridation. Possibly, afterwards the resistive element 12 may be subjected to a thermal process whereby the introduced nitrogen forms amorphous, temperature-stable clusters.

As is known, nitrogen contributes to forming covalent bonds, rather than metallic bonds, and consequently determines a decrease in the electrons present in the conduction band, and thus increases the value of resistivity of the material into which it has been introduced.

FIG. 5 shows the distribution of the nitrogen-ion content in the vertical direction (Z axis) inside the resistive element 12, after nitridation. In the example illustrated, in the first portion 12A (the top one) there is a concentration of nitrogen ions which to a first approximation is constant and has a higher value, corresponding to a high resistivity, whereas in the second portion 12b (the bottom one) the concentration of nitrogen ions is smaller and decreases almost down to zero in proximity of the interface with the bottom electrode 11. For example, the first portion 12a has a resistivity of approximately 10 mΩcm, whilst in the second portion 12b the resistivity is reduced to approximately 1 mΩcm. The profile of the nitrogen concentration, and hence of the resistivity, can in any case be engineered according to the particular requirements.

As indicated in FIG. 4 by the arrows 20, the current flows in a vertical direction (Z direction), i.e., parallel to the height of the resistive element 12, in contrast to barrier regions, made of similar alloys, wherein normally the thickness of the layer is much smaller than its width, and the current flows in a direction transverse to the larger dimension (width). In barrier regions, moreover, the resistivity is approximately uniform in the direction of the flow of current.

The resistive element 12 of FIG. 4 is obtained as described hereinafter. After depositing and patterning the bottom electrode 11, on top of the substrate (not shown) the insulating layer 16 is deposited and planarized, so as to have, at the end, a height H. The insulating layer 16 is then etched to form an opening where the resistive element 12 is to be made.

Next, the starting material of the resistive element 12, for example TiAl, TiSi, TiSi$_2$, Ta, or WSi, is deposited, and the excess material is removed from the surface of the insulating layer 16, for example by etch-back or CMP (Chemical Mechanical Polishing).

The resistive element 12 is then nitridated, for instance by an N implantation or a nitrogen-plasma implantation ("Remote Plasma Nitridation" or "Decoupled Plasma Nitridation"), or, in general, using any process that generates reactive nitrogen species (nitrogen ions or nitrogen radicals). The processes enable engineering of the nitrogen profile in the Z direction (as shown, for example, in FIG. 5), thus enabling modulation of the resistivity of the resistive element 12. Preferably, the nitridation step is carried out without the use of masks.

Next, the polycrystalline layer 13 and the layer intended to form the top electrode 15 are deposited and are then defined so as to form a strip that extends perpendicular (at least locally) to the resistive element 12. In practice, the width direction of the resistive element 12 is parallel to the direction of extension of the strip in the area of mutual contact.

The advantages of the resistive element described are illustrated hereinafter. First, modulation of the resistivity in the vertical direction enables minimization of the heat dissipation and of the voltage drop in the portion distant from the phase-change region 14 (second portion 12b in contact with the bottom electrode 11) and maximization of the same quantities in the first portion (i.e., the one in contact with the phase-change region 14), where it is important to have a good generation of heat in order to control phase change of the phase-change region 14. Thus a high local dissipation of heat is obtained in contact with the phase-change region 14 and a low dissipation elsewhere, with a consequent reduction in the risks of damage to the materials and components integrated in the chip.

The optimization of the resistivity profile moreover enables the use of programming voltages and currents lower than those required for a uniform resistive element. Consequently, it is possible to achieve better performance of the device, reduce energy consumption, and simplify the design of the components intended to generate and transport said currents and voltages.

Finally, it is clear that numerous modifications and variations may be made to the resistive element described and illustrated herein, all falling within the scope of the invention, as defined in the attached claims. For example, using a heavy implantation, it is possible to nitride preferentially the deep portion of the resistive element 12, obtaining a nitrogen and resistivity profile opposite to the one of FIG. 5. In addition, by engineering the nitridation technique, it is possible to modify the concentration profile so as to obtain, instead of a gradual reduction of the resistivity in the second portion, a sharp reduction of the resistivity, or else so as to obtain a portion of reduced thickness with a high resistivity, or yet again a profile with gradual variation of the resistivity throughout the height of the resistive element. In addition, one could use a material other than nitrogen to adjust the resistivity profile of the resistive element 12.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

What is claimed is:

1. A vertical-current-flow resistive element, comprising a monolithic region having a first portion and a second portion arranged on top of one another, said monolithic region being formed from a single material and having a height greater than at least one other dimension, said first portion having a first resistivity and said second portion having a second resistivity lower than said first resistivity, wherein said first portion has a first concentration of species forming a prevalently covalent bond with said single material, and said second portion has a second concentration of said species, lower than said first concentration, wherein said single material is conductive.

2. The resistive element according to claim 1, wherein said species have a decreasing concentration starting from said first portion towards said second portion.

3. The resistive element according to claim 2, wherein said first portion has an approximately constant resistivity.

4. The resistive element according to claim 1, wherein said second portion has a gradually decreasing resistivity starting from said first portion.

5. The resistive element according to claim 1, wherein said single material is a binary or ternary alloy.

6. The resistive element according to claim 5, wherein said conductive material is chosen from among TiAl, TiSi, TiSi$_2$, Ta, and WSi.

7. The resistive element according to claim 1, wherein said species comprise nitrogen.

8. The resistive element according to claim 1, further comprising a top electrode of conductive material in electrical contact with said first portion and a bottom electrode of conductive material in direct electrical contact with said second portion.

9. The resistive element according to claim 1, wherein said monolithic region has a shape chosen from among a column shape, having a height, a width and a depth, wherein the height is greater than the width and the depth; a wall shape, having a height, a width and a depth, wherein the depth and the height are greater than the width: and a closed shape having a height, a width and a perimeter, wherein the height and the perimeter are greater than the width.

10. A phase-change memory element, comprising:
a programmable element of chalcogenic material; and
a resistive element having a first end in direct electrical contact with said programmable element, said resistive element including a monolithic region having a first portion and a second portion arranged on top of one another, said monolithic region being formed from a single material and having a height greater than at least one other dimension, said first portion having a first resistivity and said second portion having a second resistivity lower than said first resistivity, wherein said first portion has a first concentration of species forming a prevalently covalent bond with said single material, and said second portion has a second concentration of said species, lower than said first concentration, wherein said single material is conductive.

11. The phase-change memory element according to claim 10, wherein said programmable element is formed by a strip of polycrystalline material extending, at least in proximity of said resistive element, in a preset direction, and wherein said resistive element has a width that extends in said preset direction.

12. The phase-change memory element according to claim 10, wherein said monolithic region is made of a material selected among TiAlN, TiSiN, TiSi$_2$N, TaN, WsiN.

13. A phase-change memory element, comprising:
a programmable element of chalcogenicc material; and
a resistive element having a first end in direct electrical contact with said programmable element, the resistive element including a monolithic region having a first portion and a second portion arranged on top of one another, the first portion having a first resistivity and said second portion having a second resistivity lower than said first resistivity, the first portion includes a first concentration of a species covalently bonded with a conductive material and the second portion includes a second concentration of the species covalently bonded with the conductive material, the first concentration being greater than the second concentration.

14. The phase-change memory element of claim 13 wherein the conductive material is TiSi and the species include nitrogen.

15. A phase-change memory element, comprising:
a programmable element of chalcogenic material; and
a resistive element including a monolithic region having a first portion in direct electrical contact with the programmable element, and a second portion in contact with the first portion, the first portion having a first resistivity and the second portion having a second resistivity lower than the first resistivity, wherein the first portion has a first concentration of species forming a prevalently covalent bond with a single material, and the second portion has a second concentration of the species, lower than the first concentration, wherein the single material is conductive.

16. The phase-change memory element of claim 15 wherein the conductive material is chosen from among TiAl, TiSi, TiSi$_2$, Ta, and Wsi, and the species comprise nitrogen.

17. The phase-change memory element of claim 15 wherein the first portion has an approximately constant resistivity.

18. The phase-change memory element of claim 15 wherein the second portion has a gradually decreasing resistivity starting from the first portion.

19. The phase-change memory element of claim 15 further comprising a top electrode of conductive material in electrical contact with the programmable element and a bottom electrode of conductive material in direct electrical contact with the second portion.

20. The phase-change memory element of claim 15 wherein the monolithic region has an annular cross-sectional shape.

* * * * *